US012784800B2

(12) United States Patent
Kitagawa

(10) Patent No.: US 12,784,800 B2
(45) Date of Patent: Nov. 3, 2026

(54) SLEW RATE CONTROL FOR MEMORY DEVICE BASED ON ACCESS LINE VOLTAGE

(71) Applicant: Micron Technology, Inc., Boise, ID (US)

(72) Inventor: Makoto Kitagawa, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 104 days.

(21) Appl. No.: 18/785,873

(22) Filed: Jul. 26, 2024

(65) Prior Publication Data

US 2026/0031122 A1 Jan. 29, 2026

(51) Int. Cl.
*G11C 5/14* (2006.01)
*G11C 11/22* (2006.01)

(52) U.S. Cl.
CPC .......... *G11C 11/2259* (2013.01); *G11C 5/146* (2013.01); *G11C 11/2257* (2013.01)

(58) Field of Classification Search
CPC .. G11C 11/2259; G11C 5/146; G11C 11/2257
See application file for complete search history.

(56) References Cited

U.S. PATENT DOCUMENTS 10,930,324 B2 2/2021 Jamali et al.
10,957,383 B2 3/2021 Vimercati
2009/0097312 A1* 4/2009 Binboga ................ G11C 16/24 365/185.03
2011/0064716 A1 3/2011 Soreq et al.
2014/0036595 A1* 2/2014 Binboga ............ G11C 16/3427 365/185.19
2019/0043595 A1* 2/2019 Vimercati ........... G11C 11/5642
2020/0372944 A1 11/2020 Fackenthal
2020/0409785 A1 12/2020 Fackenthal
2021/0142862 A1 5/2021 Lovett et al.
2021/0201976 A1 7/2021 Guo
2024/0412804 A1* 12/2024 Thoppa .................. G11C 16/08

* cited by examiner

*Primary Examiner* — Han Yang
*Assistant Examiner* — Elizabeth Rose Agger
(74) *Attorney, Agent, or Firm* — Schwegman Lundberg & Woessner, P.A.

(57) ABSTRACT

An electronic device may include memory cells, access lines coupled to the memory cells, and access line drivers each coupled to an access line to drive that access line. Each access line driver may be configured to receive a biasing voltage and produce an access line voltage on the respective access line. A biasing voltage generator may be configured to generate the biasing voltage to be received by the access line drivers. A biasing voltage controller may be configured to maintain a level of the biasing voltage for a specified slew rate of the access line voltage when the access line voltage is within a first range and to increase the level of the biasing voltage to maintain the specified slew rate of the access line voltage when the access line voltage is within a second range.

20 Claims, 14 Drawing Sheets

SLEW RATE CONTROL FOR MEMORY DEVICE BASED ON ACCESS LINE VOLTAGE

BACKGROUND

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. To access the stored information, a component of the device may read, or sense, at least one stored state in the memory device. To store information, a component of the device may write, or program, the state in the memory device.

Various types of memory devices exist, including those that employ magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, such as PCM and FeRAM, may maintain stored logic states for extended periods of time even in the absence of an external power source. Volatile memory devices, such as DRAM, may lose stored logic states over time unless they are periodically refreshed by a power source. In some cases, non-volatile memory may use similar device architectures as volatile memory but may have non-volatile properties by employing such physical phenomena as ferroelectric capacitance or different material phases.

Improvement of memory devices may include, for example, increasing memory cell density, increasing read/write speeds, increasing reliability, increasing data retention, reducing power consumption, and/or reducing manufacturing costs. When the memory cell density and/or the read/write speeds increase, there is a need to ensure or increase reliability of the memory devices by mitigating disturbances to each memory cell caused by signals in control lines for accessing the memory cells.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. References to "an", "one", or "various" embodiments in this disclosure are not necessarily to the same embodiment, and such references contemplate more than one embodiment. The following detailed description provides examples, and the scope of the present invention is defined by the appended claims and their legal equivalents.

The present disclosure discusses, among other things, a circuit and method for reducing memory cell disturbances by controlling slew rate of changing signals in access lines. Signals in various access lines change when data is being read from and/or written into memory cells. Some types of memory, for example ferroelectric RAM (FeRAM), use two separate operations in the performance of reading or writing functions. These two separate operations can include sensing and programming operations that comprise setting different access lines (e.g., digit lines, plate lines, and word lines) to relatively high or low levels, as discussed with reference to FIG. 1.

Figure 1:
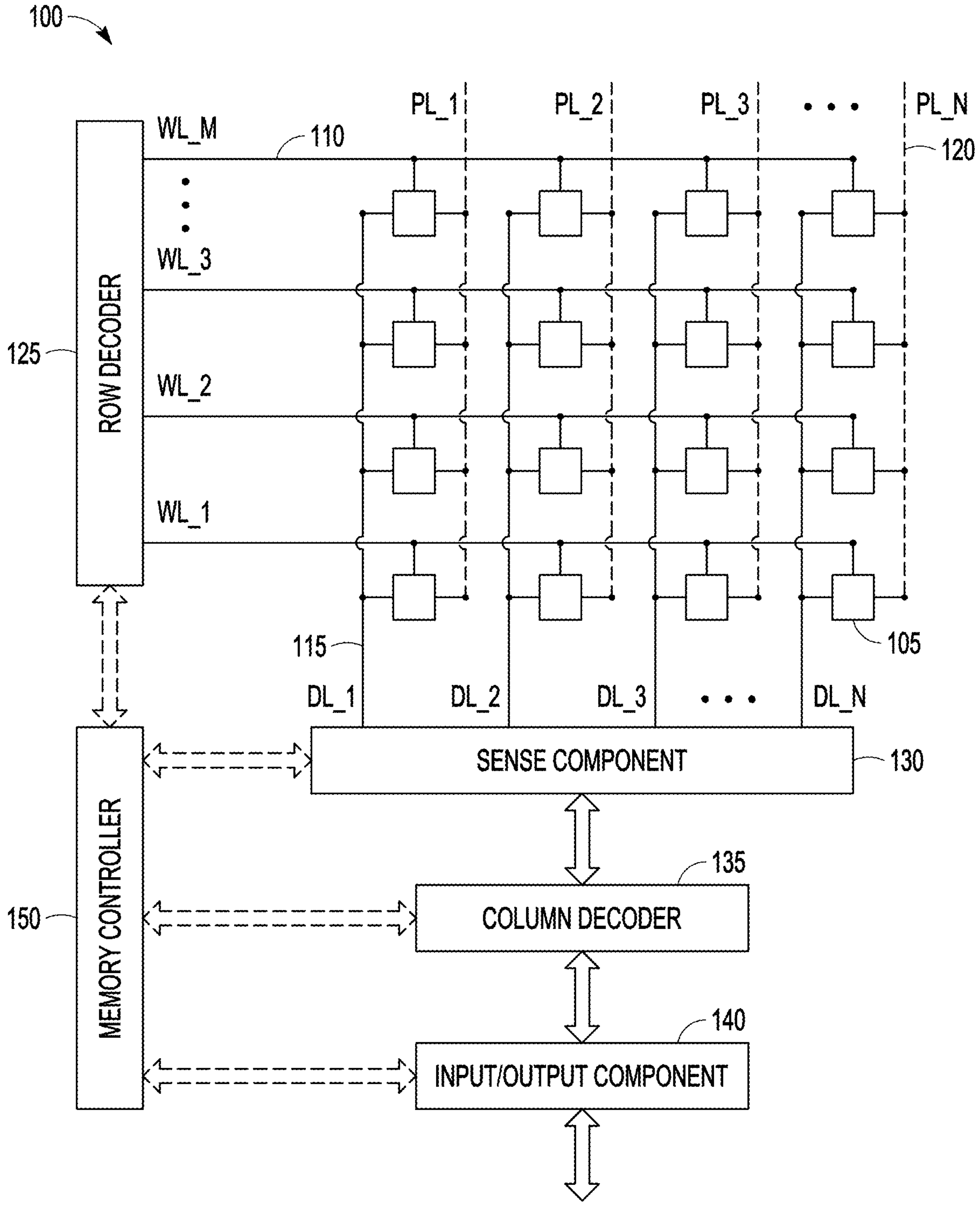
FIG. 1 illustrates an example of a memory device, according to the present subject matter.

FIG. 1 illustrates an example of a memory device 100 according to the present subject matter. Memory device 100 may also be referred to as an electronic memory apparatus. Memory device 100 includes memory cells 105 that are programmable to store different logic states. In some cases, a memory cell 105 may be programmable to store two logic states, denoted a logic 0 (or "low") and a logic 1 (or "high"). In some cases, a memory cell 105 may be programmable to store more than two logic states.

In some examples, a memory cell 105 may store an electrical charge representative of the programmable logic states in a capacitive memory element. For example, a charged and uncharged capacitor of a memory cell 105 may each represent one of two logic states, or a positively charged and a negatively charged capacitor of a memory cell 105 may each represent one of the two logic states. DRAM architectures may commonly use such a design, and the capacitor employed may include a dielectric material with linear or para-electric electric polarization properties as the insulator. In some examples, such as FeRAM architectures, a memory cell 105 may include a ferroelectric capacitor having a ferroelectric material as an insulating layer between terminals of the capacitor. Different levels of polarization of a ferroelectric capacitor may represent different logic states (e.g., supporting two or more logic states in a respective memory cell 105). Ferroelectric materials have non-linear polarization properties including those discussed in further detail below with reference to FIG. 3A and FIG. 3B.

In the example illustrated in FIG. 1, each row of memory cells 105 is coupled with one of a plurality of first access lines 110 (e.g., M word lines, WL_1, WL_2, WL_3, . . . and WL_M, as shown in FIG. 1, also referred to as row lines), and each column of memory cells 105 is coupled with one of a plurality of second access lines 115 (e.g., N digit lines, DL_1, DL_2, DL_3, . . . and DL_N, as shown in FIG. 1, also referred to as bit lines or column lines). Thus, each memory cell 105 may be located at the intersection of one of the first access lines 110 and one of the second access lines 115. This intersection may be referred to as an address of that memory cell 105. In some cases, first access lines 110 and second access lines 115 may be substantially perpendicular to one another in memory device 100. References to digit lines and bit lines, or their analogues, are interchangeable without loss of understanding or operation. A memory cell 105 targeted to be accessed may be referred to as targeted memory cell 105 and located at the intersection of an energized or otherwise selected access line 110 and an energized or otherwise selected access line 115. In other words, an access line 110 and an access line 115 may be energized or otherwise selected to access (e.g., read from or write into) a memory cell 105 at their intersection. Other memory cells 105 that are in electronic communication with (e.g., connected to) the same access line 110 or 115 may be referred to as untargeted memory cells 105.

Although the access lines discussed with reference to FIG. 1 are shown as direct lines between memory cells 105 and coupled components, access lines may include other circuit elements, such as capacitors, resistors, transistors, amplifiers, voltage sources, switching components, selection components, and others, which may be used to support access operations including those discussed herein. In some examples, an electrode may be coupled with (e.g., between) a memory cell 105 and an access line 110, or with (e.g., between) a memory cell 105 and an access line 115. The term electrode may refer to an electrical conductor, or other electrical interface between components, and in some cases, may be employed as an electrical contact to a memory cell 105. An electrode may include a trace, wire, conductive line, conductive layer, conductive pad, or the like, that provides a conductive path between elements or components of memory device 100.

In some architectures, the component storing the logic state (e.g., a capacitive memory element) of a memory cell 105 may be electrically isolated from a second access line 115 by a selection component. A first access line 110 may be coupled with and may control the selection component. For example, the selection component may be a transistor and the first access line 110 may be coupled with a gate of the transistor. Activating the first access line 110 may result in an electrical connection or closed circuit between the component storing the logic state of the memory cell 105 and its corresponding second access line 115. The second access line 115 may then be accessed to read and/or write the memory cell 105.

In some examples, memory cells 105 may also be coupled with one of a plurality of third access lines 120 (e.g., N plate lines, PL_1, PL_2, PL_3, . . . and PL_N, as shown in FIG. 1). In some examples, the plurality of third access lines may couple memory cells 105 with a voltage source for various reading and/or writing operations including those discussed herein. For example, when a memory cell 105 employs a capacitor for storing a logic state, a second access line 115 may provide access to a first terminal of the capacitor, and a third access line 120 may provide access to a second terminal of the capacitor. As used herein, the term "terminal" need not suggest a physical boundary or connection point of a capacitor of a memory cell 105. Rather, "terminal" may refer to a reference point of a circuit relevant to the capacitor of the memory cell, which may also be referred to as a "node" or "reference point." Although the plurality of third access lines 120 of the memory device 100 are shown as substantially parallel with the plurality of second access lines 115, in other examples a plurality of third access lines 120 may be substantially parallel with the plurality of first access lines 110, or in any other configuration.

Access operations such as reading, writing, and rewriting may be performed on a memory cell 105 by activating or selecting a first access line 110, a second access line 115, and/or a third access line 120 coupled with the memory cell 105, which may include applying a voltage, a charge, and/or a current to the respective access line. Access lines 110, 115, and 120 may be made of conductive materials, such as metals (e.g., copper (Cu), silver (Ag), aluminum (Al), gold (Au), tungsten (W), titanium (Ti), etc.), metal alloys, carbon, or other conductive materials, alloys, or compounds. Upon selecting a memory cell 105, a resulting signal may be used to determine the stored logic state. For example, a memory cell 105 with a capacitive memory element storing a logic state may be selected, and the resulting flow of charge via an access line and/or resulting voltage of an access line may be detected to determine the programmed logic state of the memory cell 105.

Access to memory cells 105 may be controlled through a row decoder 125 and a column decoder 135. For example, a row decoder 125 may receive a row address from a memory controller 150 and activate the appropriate first access line 110 based on the received row address. Similarly, a column decoder 135 may receive a column address from memory controller 150 and activate the appropriate second access line 115 based on the received column address. Thus, in some examples a memory cell 105 may be accessed by activating a first access line 110 and a second access line 115.

In some examples, memory controller 150 may control the operations (e.g., read operations, write operations, rewrite operations, and refresh operations, discharge operations) of memory cells 105 through the various components (e.g., row decoder 125, column decoder 135, and a sense component 130). In some cases, one or more of the row decoder 125, column decoder 135, and sense component 130 may be co-located or otherwise included with memory controller 150. Memory controller 150 may generate row and column address signals to activate a desired access line 110 and access line 115. The memory controller 150 may also generate or control various voltages or currents used during the operation of memory device 100. For example, the memory controller 150 may apply a discharge voltage to an access line 110 or an access line 115 after accessing one or more memory cells 105.

In general, the amplitude, shape, or duration of an applied voltage, current, or charge may be adjusted or varied, and may be different for the various operations discussed in operating the memory device 100. Further, one, multiple, or all memory cells 105 within memory device 100 may be accessed simultaneously. For example, multiple or all memory cells 105 of memory device 100 may be accessed simultaneously during a reset operation in which all memory cells 105, or a group of memory cells 105, are set to a single logic state.

A memory cell 105 may be read, or sensed, by a sense component 130. For example, sense component 130 may be configured to determine the stored logic state of a memory cell 105 based on a signal generated by accessing that memory cell 105. The signal may include a voltage, an electrical charge, an electrical current, or a combination thereof, and sense component 130 may include voltage sense amplifiers, charge sense amplifiers, current sense amplifiers, or a combination of two or more of such amplifiers.

In some examples, a threshold current may be defined for sensing the logic state stored by a memory cell 105. The threshold current may be set above a current that may pass through that memory cell 105 in response to a read signal when that memory cell 105 stores a first logic state, but equal to or below an expected current through that memory cell 105 in response to the read signal when that memory cell 105 stores a second logic state. For example, the threshold current may be higher than a leakage current of the associated access lines 110 or 115. In some examples, a logic state stored by a memory cell 105 may be determined based on a voltage (e.g., across a shunt resistance) resulting from the current driven by a read pulse. For example, the resulting voltage may be compared to a reference voltage, with a first logic state being detected when the resulting voltage is less than the reference voltage and a second logic state detected when the resulting voltage is greater than the reference voltage.

Sense component 130 may include various switching components, selection components, transistors, amplifiers, capacitors, resistors, or voltage sources to detect and amplify a difference in sensing signals (e.g., a difference between a read voltage and a reference voltage, a difference between a read current and a reference current, or a difference between a read charge and a reference charge), aspects of which, in some examples, may be referred to as latching. In some examples, sense component 130 may include a collection of components (e.g., circuit elements) that may be repeated for each of a set of access lines 115 connected to the sense component 130. For example, sense component 130 may include a separate sensing circuit (e.g., a separate sense amplifier, or a separate signal development circuit) for each of a set of access lines 115 coupled with the sense component 130, such that a logic state may be separately detected for a respective memory cell 105 coupled with a respective one of the set of access lines 115. In various examples, a reference signal source or generated reference signal may be shared between components of memory device 100 (e.g., shared among one or more components of sense components 130, such as separate sensing circuits of sense component 130).

Sense component 130 may be included in a device that includes memory device 100. For example, sense component 130 may be included with other read and write circuits, decoding circuits, or register circuits of the memory that may be coupled to memory device 100. In some examples, the detected logic state of a memory cell 105 may be output through a column decoder 135 as an output. In some examples, sense component 130 may be part of column decoder 135 or row decoder 125. In some examples, sense component 130 may be connected to or otherwise in electronic communication with column decoder 135 or row decoder 125.

Although a single sense component 130 is shown, memory device 100 may include more than one sense component 130. For example, a first sense component 130 may be coupled with a first subset of access lines 115 and a second sense component 130 may be coupled with a second subset of access lines 115 (e.g., different from the first subset of access lines 115). In some examples, such a division of sense components 130 may support parallel (e.g., simultaneous) operation of multiple sense components 130. In some examples, such a division of sense components 130 may support matching sense components 130 having different configurations or characteristics to particular subsets of the memory cells 105 of the memory device (e.g., supporting different types of memory cells 105, supporting different characteristics of subsets of memory cells 105, and/or supporting different characteristics of subsets of access lines 115). Additionally or alternatively, two or more sense components 130 may be coupled with the same set of access lines 115 (e.g., for component redundancy). In some examples, such a configuration may support maintaining functionality to overcome a failure or otherwise poor operation of one of the redundant sense components 130. In some examples, such a configuration may support the ability to select one of the redundant sense components 130 for particular operational characteristics (e.g., as related to power consumption characteristics and/or as related to access speed characteristics for a particular sensing operation).

In ferroelectric memory architectures, accessing a memory cell 105 may degrade or destroy the stored logic state, and rewrite or refresh operations may be performed to return the original logic state to that memory cell 105. In DRAM or FeRAM, for example, a capacitor of a memory cell 105 may be partially or completely discharged during a sense operation, thereby corrupting the logic state that was stored in that memory cell 105. Thus, in some examples, the logic state stored in a memory cell 105 may be rewritten after an access operation. Further, activating a single access line 110 or 115 may result in the discharge of all memory cells 105 coupled with the access line 110 or 115. Thus, several or all memory cells 105 coupled with an access line 110 or 115 of an access operation (e.g., all cells of an accessed row, all cells of an accessed column) may be rewritten after the access operation.

A ferroelectric memory element (e.g., a ferroelectric capacitor) of a memory cell 105 may be written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage may be applied across the ferroelectric memory element (e.g., by grounding or virtually grounding the ferroelectric memory element).

Figure 2:
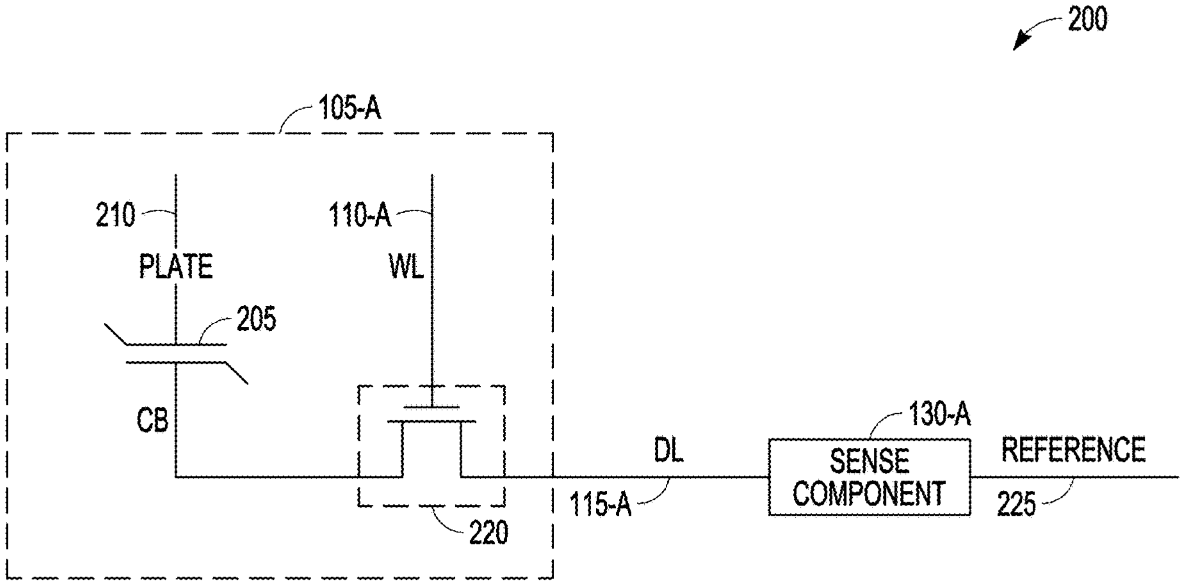
FIG. 2 illustrates an example of a circuit for memory access in a memory device, such as the memory device of FIG. 1, according to the present subject matter.

FIG. 2 illustrates an example of a circuit 200 for memory access in a memory device, such as memory device 100, according to the present subject matter. Circuit 200 may include a ferroelectric memory cell 105-A, a word line 110-A ("WL" as shown in FIG. 2), a digit line 115-A ("DL" shown in FIG. 2), and a sense component 130-A, which may respectively be an example of memory cells 105, an example of access lines 110, an example of access lines 115, and an example of sense component 130 or a portion thereof. Circuit 200 includes a logic storage component, such as a capacitor 205 that includes two conductive terminals, a cell plate 210 ("Plate" as shown in FIG. 2) and a cell bottom 215 ("CB" as shown in FIG. 2). These terminals may be separated by an insulating ferroelectric material. As discussed above, various logic states may be stored by charging or discharging capacitor 205. Cell plate 210 may correspond to an example of plate lines 120 and therefore may also be referred to as plate line 210.

The stored logic state of capacitor 205 may be read, or sensed, by operating various elements of circuit 200. Capacitor 205 may be in electronic communication with digit line 115-A. Capacitor 205 may be isolated from the digit line 115-A when selection component 220 is deactivated, and capacitor 205 may be connected to digit line 115-A via selection component 220 when selection component 220 is activated. In some cases, selection component 220 may be a transistor and its operation may be controlled by applying a voltage to the transistor gate through word line 110-A, with the magnitude of the applied voltage being greater than the threshold magnitude of the transistor. For example, a voltage applied to word line 110-A and hence the transistor gate may activate selection component 220, thereby connecting capacitor 205 with digit line 115-A.

In some examples, capacitor 205 is a ferroelectric capacitor. The change in stored charge depends on the initial state of capacitor 205, i.e., whether the initial state corresponds to a logic 1 or a logic 0. The change in charge stored in capacitor 205 may then be compared to a reference (e.g., a reference voltage) by sense component 130-A in order to determine the logic state stored in memory cell 105-A. To write memory cell 105-A, a voltage may be applied across capacitor 205.

Figure 3A:
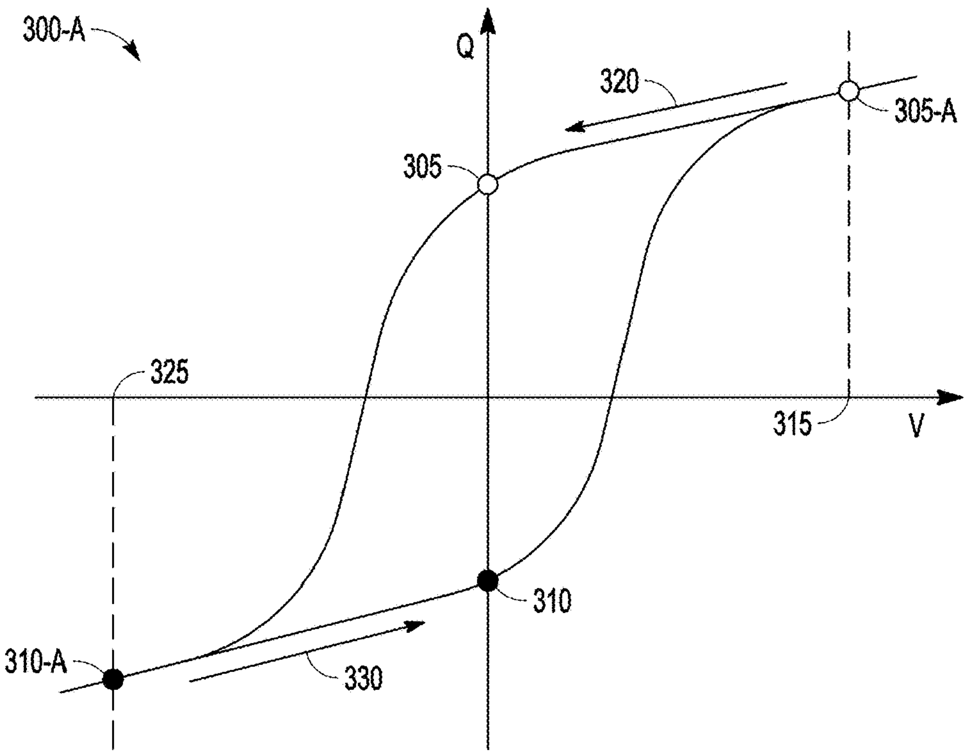
FIGS. 3A and 3B illustrate examples of non-linear electrical properties with hysteresis plots for a ferroelectric memory cell, such as a ferroelectric memory cell in the memory device of FIG. 1, with FIG. 3A corresponding to a writing process and FIG. 3B corresponding to a reading process, according to the present subject matter.
Figure 3B:
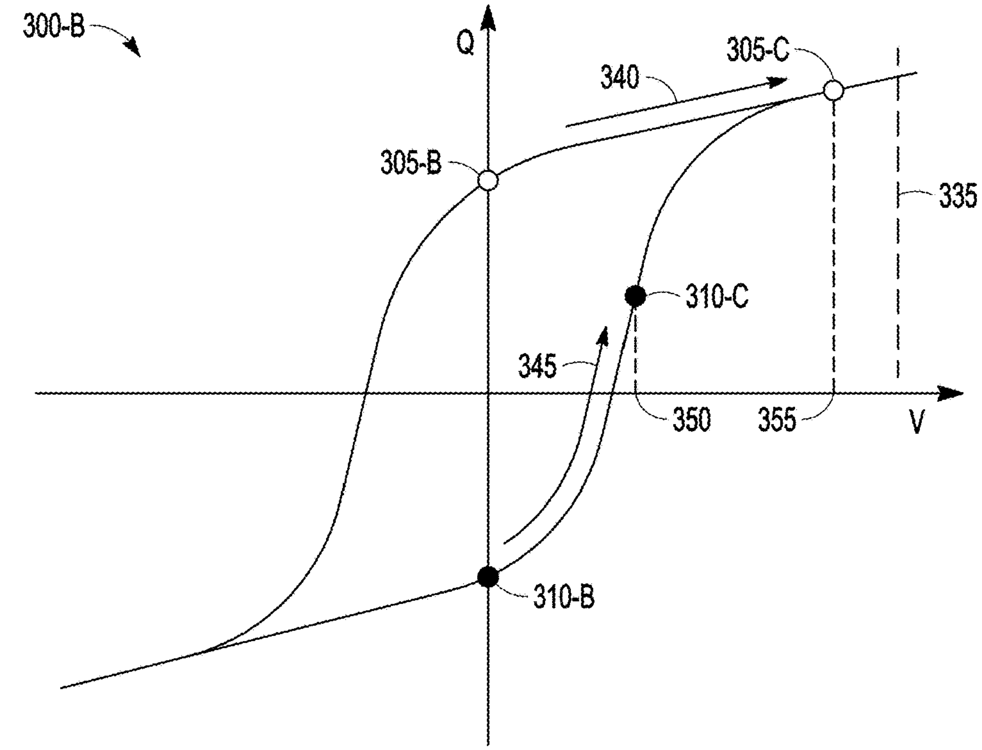

FIG. 3A and FIG. 3B illustrate examples of non-linear electrical properties with hysteresis plots for a ferroelectric memory cell in a memory device, such as memory device 100, according to the present subject matter. Hysteresis curves 300-A, shown in FIG. 3A, and 300-B, shown in FIG. B, illustrate an example of writing and reading process, respectively, for a ferroelectric memory cell, such as memory cell 105-A. Hysteresis curves 300 depict the charge, Q, stored on a ferroelectric capacitor, such as capacitor 205, as a function of a voltage difference, V, applied on the ferroelectric capacitor.

A ferroelectric material is characterized by a spontaneous electric polarization. For example, the ferroelectric material maintains a non-zero electric polarization in the absence of an electric field. Examples of the ferroelectric material include barium titanate ($BaTiO3$), lead titanate ($PbTiO3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, charge leakage may be significantly decreased as compared with, for example, capacitors employed in volatile memory arrays. This may reduce the need to perform refresh operations as described above for some volatile memory architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal and maintaining the other terminal at ground (or approximately 0 V). A negative voltage may be applied by maintaining the terminal at ground and applying a positive voltage to the other terminal. Similarly, two positive voltages, two negative voltages, or any combination of positive and negative voltages may be applied to the appropriate capacitor terminals to generate the voltage difference shown in hysteresis curves 300.

As shown in hysteresis curve 300-A, the ferroelectric material may maintain a positive or negative polarization with a zero-voltage difference, resulting in two possible charged states: charge state 305-A and charge state 310-A. In the example of FIG. 3A, charge state 305 represents a logic 0 and charge state 310 represents a logic 1. In some examples, the logic values of the respective charge states may be reversed without loss of understanding.

A logic 0 or 1 may be written to the memory cell by controlling the electric polarization of the ferroelectric material, and thus the charge on the capacitor terminals, by applying a voltage. For example, applying a net positive voltage 315 across the capacitor results in charge accumulation until charge state 305-A is reached. Upon removing voltage 315, charge state 305-A follows path 320 until it reaches charge state 305 at zero voltage potential. Similarly, charge state 310 is written by applying a net negative voltage 325, which results in charge state 310-A. After removing negative voltage 325, charge state 310-A follows path 330 until it reaches charge state 310 at zero voltage. In some example aspects, after sensing, stored data in a cell is destroyed (e.g., written to "0" regardless of the original data). Accordingly, if a "0" is to be programmed into the cell, no further action is needed. However, if a "1" is to be programmed into the cell, then writing a "1" as described above may occur.

To read, or sense, the stored state of the ferroelectric capacitor, a voltage may be applied across the capacitor. In response, the stored charge changes, and the degree of the change depends on the initial charge state, i.e., the degree to which the stored charge of the capacitor changes varies depending on whether charge state 305-B or 310-B was initially stored. For example, hysteresis curve 300-B illustrates two possible stored charge states 305-B and 310-B. Net voltage 335 may be applied across the capacitor. Although depicted as a positive voltage, voltage 335 may be negative. In response to voltage 335, charge state 305-B may follow path 340. Likewise, if charge state 310-B was initially stored, then it follows path 345. The final position of charge state 305-C and charge state 310-C depend on a number of factors, including the specific sensing operation and circuitry.

In some cases, the final charge may depend on the intrinsic capacitance of the digit line of a memory cell. For example, if the capacitor is electrically connected to the digit line and voltage 335 is applied, the voltage of the digit line may rise due to its intrinsic capacitance. Therefore, a voltage measured at a sense component may not equal voltage 335 and instead may depend on the voltage of the digit line. The position of final charge states 305-C and 310-C on hysteresis curve 300-B may thus depend on the capacitance of the digit line and may be determined through a load-line analysis, i.e., charge states 305-C and 310-C may be defined with respect to the digit line capacitance. As a result, the voltage of the capacitor, voltage 350 or voltage 355, may be different and may depend on the initial state of the capacitor. By comparing voltage 350 or voltage 355 to a reference voltage, the initial state of the capacitor may be determined. For example, the reference voltage may be an average of voltage 350 and 355 and, upon comparison, the sensed voltage may be determined to be higher or lower than the reference voltage. A value of the ferroelectric cell (i.e., a logic 0 or 1) may then be determined based on the comparison.

Figure 4:
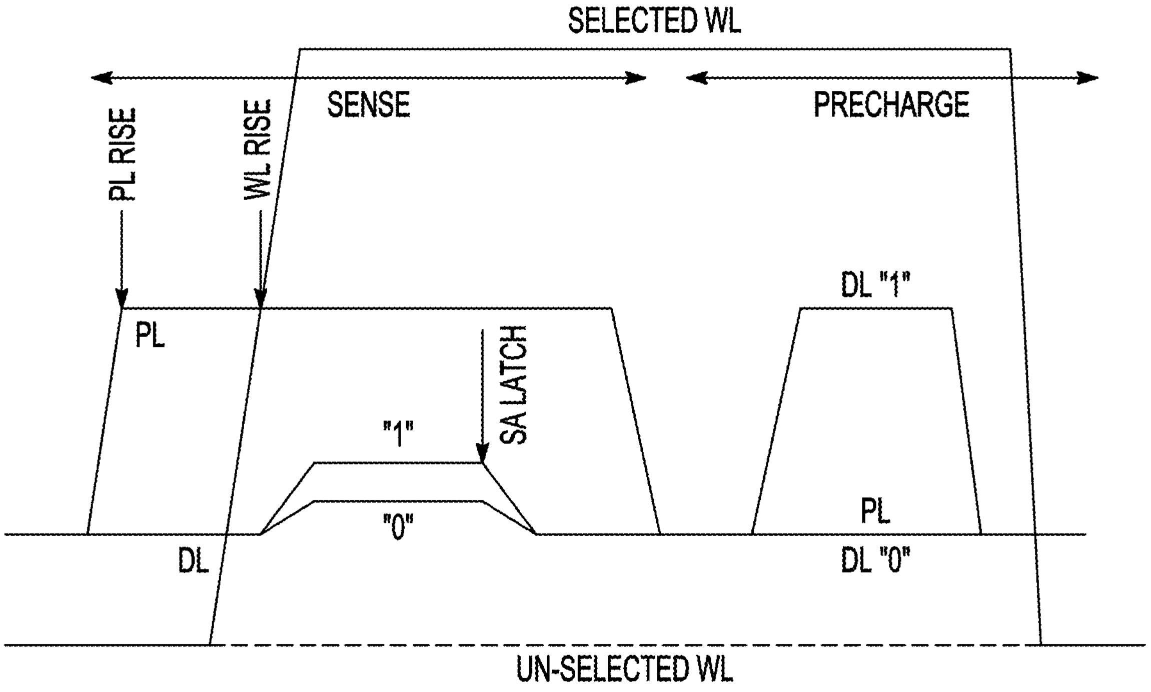
FIG. 4 illustrates an example of a timing diagram for a sensing operation in a memory device such as the memory device of FIG. 1, according to the present subject matter.

FIG. 4 illustrates an example of a timing diagram for a sensing operation in a memory device such as memory device 400, according to the present subject matter. An access operation performed on a selected ferroelectric memory cell includes two phases: a sensing phase (during which a voltage difference is applied to the capacitive component, the logic state of the memory cell is sensed, and written back if applicable) and a precharge phase (during which the voltage difference returns to zero, and the memory cell returns to a stable logic state), as illustrated in FIG. 3B.

Digit line low (DL=L) sensing is the case illustrated in FIG. 4. During the sensing phase, the plate (PL) rises (e.g., from ground, or 0 V) (e.g., to 1.0 V) and returns, the selected word line (SELECTED WL) rises (e.g., from −0.2 V to 3.0 V), and the digit line (DL) rises (e.g., from ground to 0.2 V if DL=1, or to 0.1 V if DL=0) and returns after the sense amplifier latches (SA LATCH). During the precharge phase, the plate (PL) stays low (e.g., at ground), the selected word line falls (e.g., from 3.0 V to −0.2 V), and the digit line (DL) rises (e.g., from ground to 1.0 V) if DL=1, or stays low (e.g., at ground) if DL=0.

Thus, as illustrated in FIG. 4, at the end of the sensing phase, the plate voltage is ramped down while the selected word line stays high. This change of the plate voltage may result in glitches in the selected word line and unselected digit line, thereby causing memory cell disturbances. The present subject matter provides for control of the slew rate of an access line, for example the plate slew rate (i.e., ramping speed of the plate voltage), to reduce glitches on other access lines (e.g., the selected word line and unselected digit line), thereby mitigating disturbances of memory cells.

Figure 5:
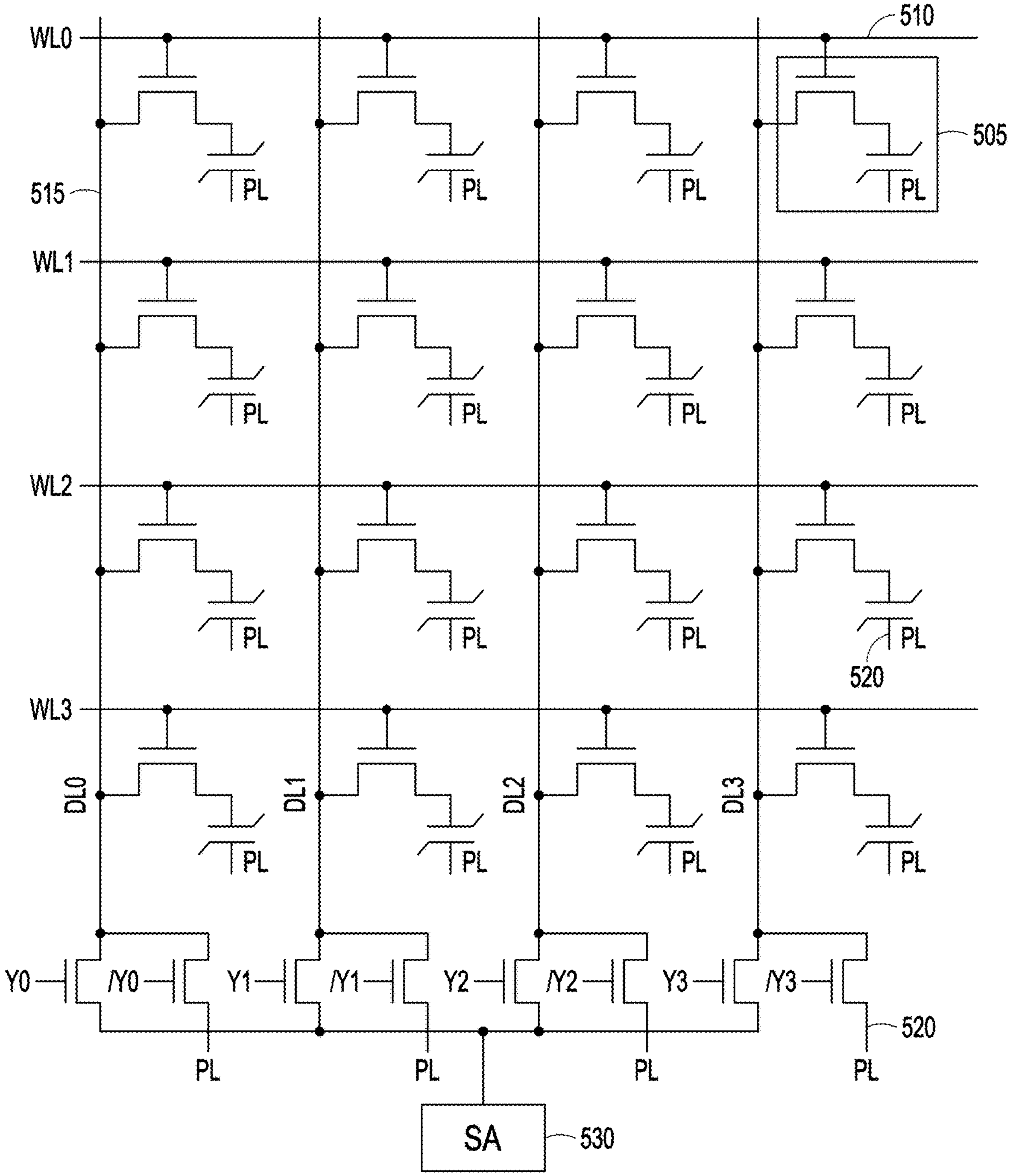
FIG. 5 illustrates an example of portions of a memory device showing a memory device architecture, according to the present subject matter.

FIG. 5 illustrates an example of portions of a memory device, such as memory device 400, showing a memory device architecture, according to the present subject matter. The memory device includes an array of memory cells 505 each coupled to and accessible through a plate 520 (PL), one of digit lines 515 (DL0, DL1, DL2, or DL3), and one of word lines 510 (WL0, WL1, WL2, or WL3). A sense amplifier 530 may selectively access each of memory cells 505 through a pair of complementary selection lines (Y0 and/Y0, Y1 and/Y1, Y2 and/Y2, or Y3 and/Y3).

In such a memory device, changes in the plate voltage may cause disturbances of the memory cell on the selected word line and unselected digit line, unless the plate voltage and the digit line voltage change simultaneously. In practice, due to the difference between the resistances and capacitances of the plate and the digit line, there is a delay between the change in the plate voltage and the following change in the digit line voltage. To mitigate the disturbance on the memory cell, this delay may be reduced by controlling the slew rate of the plate voltage (i.e., the ramping speed of the plate voltage). The slew rate of the plate voltage may be controlled such that the change in the digit line voltage may follow the changes in the plate voltage as closely as possible.

Figure 6:
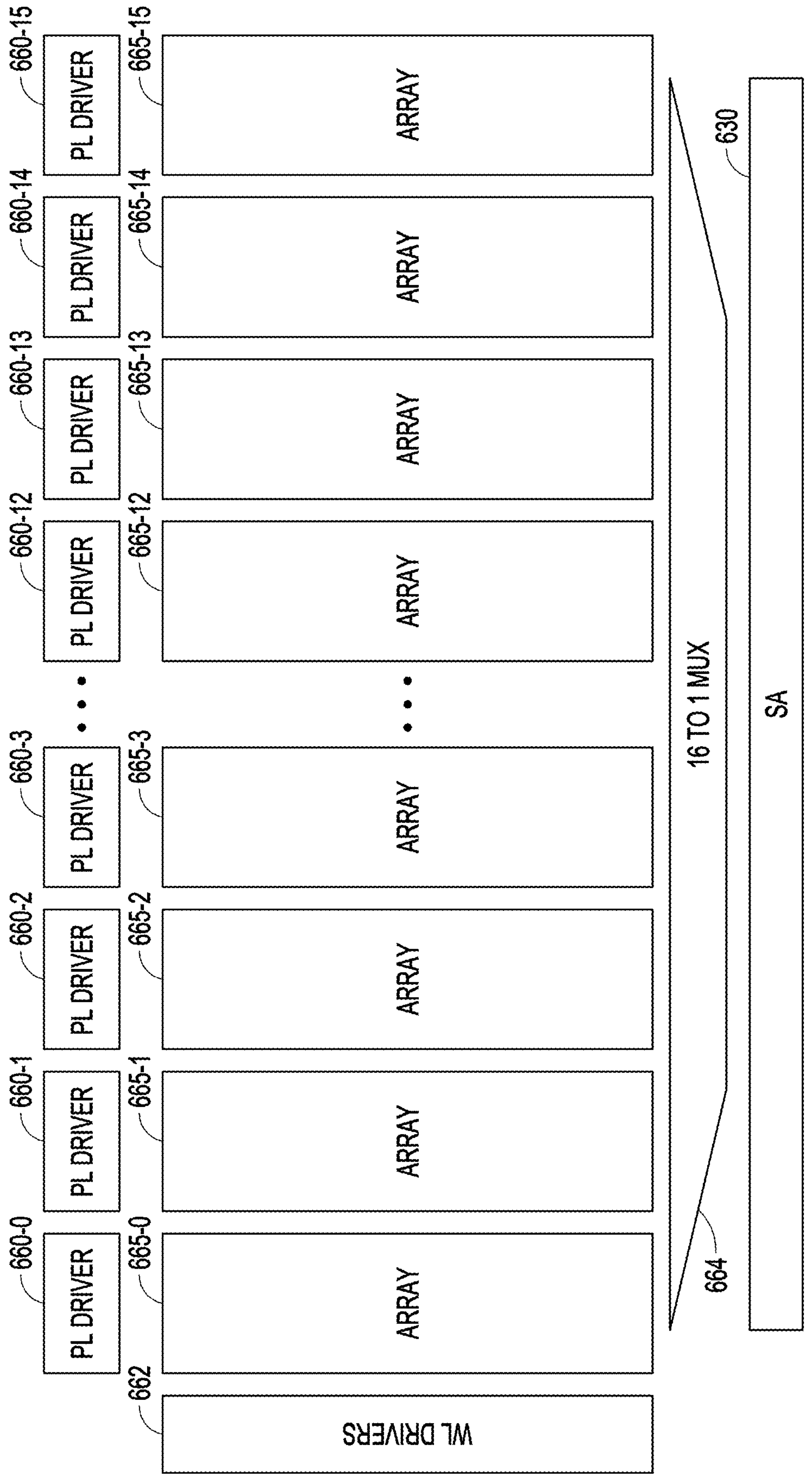
FIG. 6 illustrates another example of a portion of a memory device showing a type of memory device architecture, according to the present subject matter.

FIG. 6 illustrates another example of a portion of a memory device, such as memory device 400, showing a type of memory device architecture, according to the present subject matter. The portions of the memory device, as shown in FIG. 6 by way of example for illustrative but not restrictive purposes, includes 16 memory cell arrays 665-0, 665-1, 665-2, 665-3, . . . 665-12, 665-13, 665-14, 665-15, word line (WL) drivers 662, 16 plate (PL) drivers 660-0, 660-1, 660-2, 660-3, . . . 660-12, 660-13, 660-14, 660-15, a 16-to-1 multiplexer (MUX) 664, and a sense amplifier 630. Memory arrays 665 each include a respective plate driven by a respective plate driver of plate drivers 660. Sense amplifier 630 accesses memory cells through 16-to-1 multiplexer 664. This type of memory device architecture may be used for memory device 100 for reducing power consumption required for driving the plate voltage. In this architecture, only one plate out of 16 plates is selected and driven to change at a time.

Figure 7:
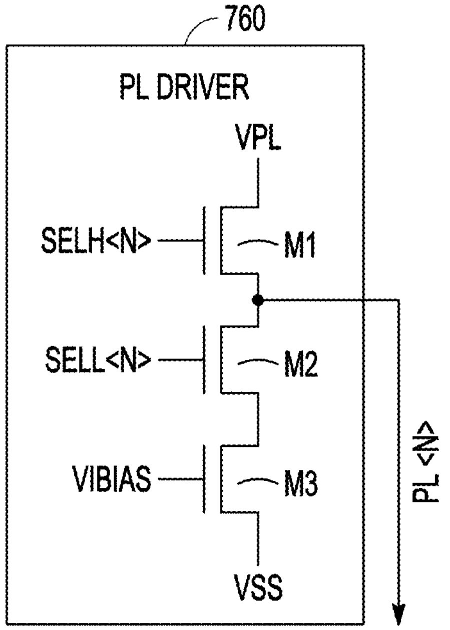
FIG. 7 illustrates an example of a plate driver in a memory device, such as the memory device of FIG. 6, according to the present subject matter.

FIG. 7 illustrates an example of a plate (PL) driver 760 in a memory device, such as the memory device of FIG. 6, according to the present subject matter. The memory device may include N plates driven by respective N plate drivers 760. Each plate (e.g., PL<N>) is selectable via a pair of complementary selection lines (e.g., SELH<N> and SELL<N>) driving respective transistors M1 and M2, used as switches for activating plate driver 760. A transistor M3 may receive a biasing voltage (VIBIAS) to produce a biasing current driving the plate line (PL<N>). The magnitude of the biasing current, which is a function of the biasing voltage, affects the slew rate of the plate voltage (i.e., the voltage on PL<N>). In the illustrated example, transistors M1, M2, and M3 are each an n-channel metal-oxide-semiconductor field-effect transistor (NMOS transistor). Plate driver 760 is coupled between voltage supply lines VPL (voltage supply lines for producing the plate voltage) and VSS (voltage supply line for the source of NMOS transistor, e.g., the digital ground of the memory device).

Figure 8:
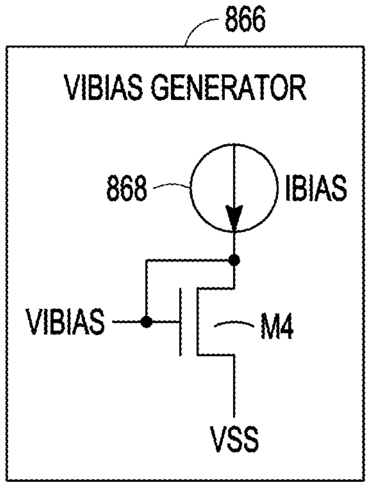
FIG. 8 illustrates an example of a biasing voltage generator for providing a biasing voltage for the plate driver of FIG. 7, according to the present subject matter.

FIG. 8 illustrates an example of a biasing voltage generator 866 for providing the biasing voltage (VIBIAS) for plate driver 760, according to the present subject matter. Biasing voltage generator 866 may include a transistor M4 coupled between a current source 868 and VSS and with its drain shorted to the gate, which may receive the biasing voltage. Biasing voltage generator 866 may provide the biasing current (IBIAS) that is necessary to drive each of plate drivers 760. In the illustrated example, transistor M4 is an NMOS transistor.

Figure 9:
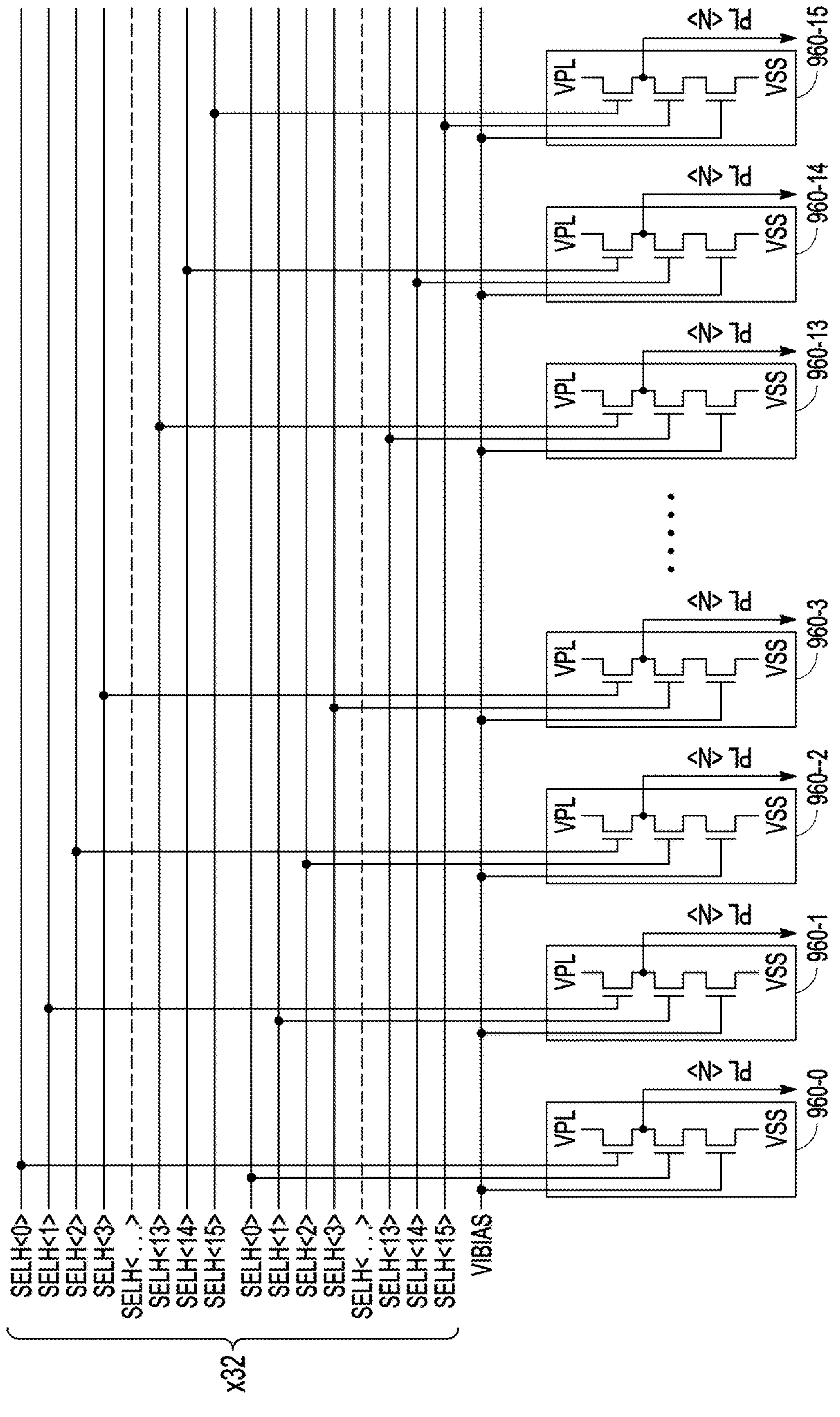
FIG. 9 illustrates an example of a group of place drivers in a memory device, such as the memory device of FIG. 6, according to the present subject matter.

FIG. 9 illustrates an example of a group of plate drivers 960-0, 960-1, 960-2, 960-3, . . . 960-13, 960-14, 960-15 in a memory device, such as the memory device of FIG. 6, according to the present subject matter. Plate driver 960 may each include a respective instance of plate driver 760, and the biasing voltage (VIBIAS) may be provided using a biasing voltage generator such as biasing voltage generator 866. Plate drivers 960 (and the respective plates being driven) are selectable one at a time via complementary pairs of selection lines SELH<0> and SELL<0>, SELH<1> and SELL<1>, SELH<2> and SELL<2>, SELH<3> and SELL<3>, . . . SELH<13> and SELL<13>, SELH<14> and SELL<14>, SELH<15> and SELL<15>. The biasing voltage generator providing biasing current to plate drivers 960 may be large for reducing mismatch. Thus, the overall size of circuitry for driving plates 960 may be large due to the biasing voltage generator size, and a large number of signals is required for selecting a particular plate from 16 plates. The slew rate of the plate voltage may be increased by increasing the biasing voltage. However, to increase the biasing voltage, the overall size of the corresponding drive circuitry and the power consumption for driving the plates will be increased.

Figure 10:
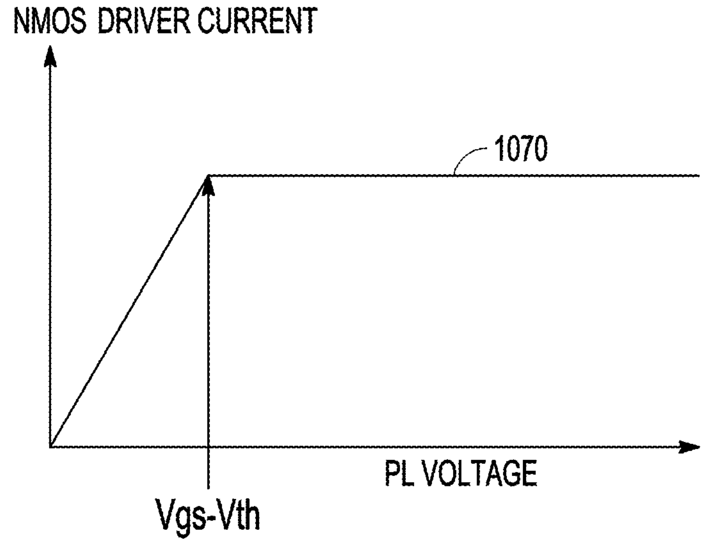
FIG. 10 illustrates an example of a current-voltage curve of a transistor in a plate driver, such as the plate driver of FIG. 7, according to the present subject matter.

FIG. 10 illustrates an example of a current-voltage (IV) curve 1070 of a transistor in a plate driver, such as transistor M3 in plate driver 760, according to the present subject matter. The transistor for the illustrated example is an NMOS transistor. IV curve 1070 is the NMOS driver current (e.g., biasing current produced by M3) plotted against the plate (PL) voltage produced. The transistor operates in saturation when the plate voltage is above the difference between the gate-to-source voltage and the threshold voltage of the transistor (Vgs-Vth). In an example, the NMOS driver current is about 100 μA when the transistor operates in saturation, and the threshold voltage is about 0.8 V.

Figure 11:
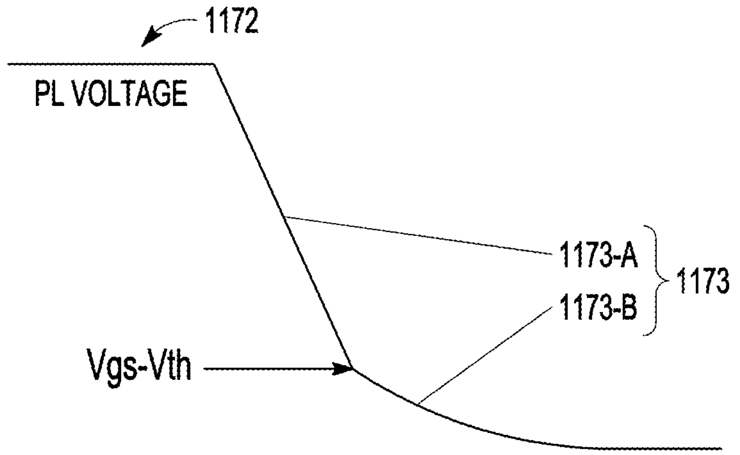
FIG. 11 illustrates an example of a plate voltage produced using the plate driver of FIG. 10, according to the present subject matter.

FIG. 11 illustrates an example of a plate voltage 1172 produced using the plate driver having the IV curve 1070, according to the present subject matter. Plate voltage 1172 includes a falling segment 1173 that includes a first portion 1173-A, when the plate voltage is above Vgs-Vth, and a second portion 1173-B, when the plate voltage is below Vgs-Vth. The slew rate of falling segment 1173 decreases when the plate voltage falls below Vgs-Vth, when the NMOS transistor is out of saturation, resulting in the low slew rate of second portion 1173-B. This decreased slew rate of the plate voltage when the NMOS transistor is not in saturation contributes to the delay of digit line signal changes in following plate voltage changes. When the slew rate of the first portion 1173-A is sufficiently high (e.g., as provided using a sufficiently high biasing voltage generated by biasing voltage generator 866), there is a need for increasing the slew rate for the second portion 1173-B. Increasing the slew rate for the second portion 1173-B by increasing the biasing voltage (e.g., generated by biasing voltage generator 866) for the entire duration of falling segment 1173 will result in unnecessary increase of the slew rate of the first portion 1173-A and require undesirable or unacceptable increase in the circuit size and power consumption, as discussed above with reference to FIG. 9.

Figure 12:
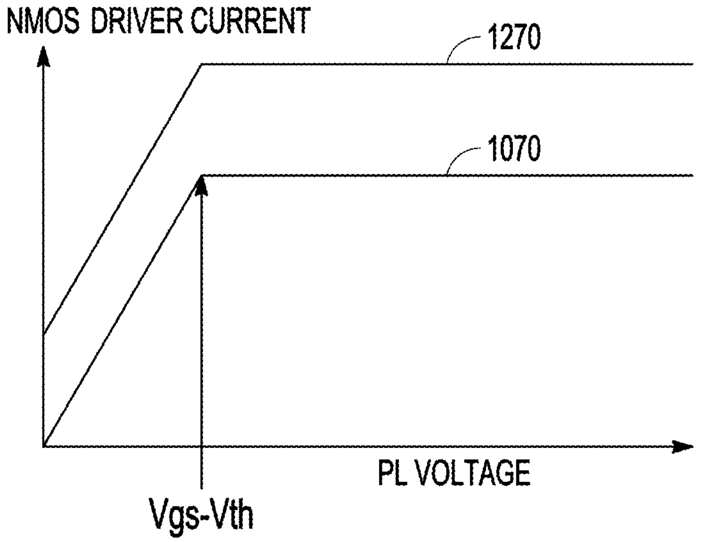
FIG. 12 illustrates another example of a current-voltage curve of a transistor in a plate driver, such as the plate driver of FIG. 7, according to the present subject matter.

FIG. 12 illustrates an example of a current-voltage (IV) curve 1270 of a transistor in a plate driver, such as transistor M3 in plate driver 760, according to the present subject matter. IV curve 1070 is also shown in FIG. 12 as a reference for comparison. The transistor for the illustrated example is the same NMOS transistor as in FIG. 10. IV curve 1270 is the NMOS driver current (e.g., biasing current produced by M3) plotted against the plate (PL) voltage produced, with a higher NMOS driver current provided by a higher biasing voltage. In an example, the NMOS driver current is about 150 μA for IV curve 1270, and about 100 μA for IV curve 1070, when the transistor operates in saturation.

The present subject matter provides a two-step control of the plate voltage slew control. When the plate voltage is above Vgs-Vth, a level of the biasing voltage is provided (e.g., by biasing voltage generator 866) to provide the required or desirable slew rate of the plate voltage. When the plate voltage is below Vgs-Vth, another level of the biasing voltage is provided (e.g., by biasing voltage generator 866) to provide the required or desirable slew rate of the plate voltage. This avoids the increase in circuit size and power consumption associated with the unnecessary increase of the slew rate of the plate voltage when the transistor is operating in saturation.

Figure 13:
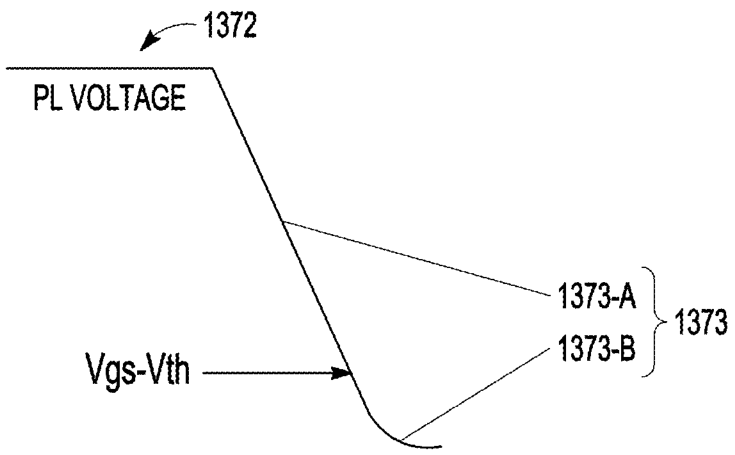
FIG. 13 illustrates an example of a plate voltage produced using the plate driver of FIG. 12, according to the present subject matter.

FIG. 13 illustrates an example of a plate voltage 1372 produced using the plate driver having the IV curve 1270, according to the present subject matter. Plate voltage 1372 includes a falling segment 1373 that includes a first portion 1373-A, when the plate voltage is above Vgs-Vth, and a second portion 1373-B, when the plate voltage is below Vgs-Vth. While the slew rate of first portion 1373-A may be about the same as the slew rate of first portion 1173-A (shown in FIG. 11), the slew rate of second portion 1373-B may be substantially higher than the slew rate of first portion 1173-B. This may be achieved by providing the plate driver with a biasing voltage that is maintained at a first level when the transistor of the plate driver (e.g., M3 of plate driver 760) operates in saturation and increased to a second level when the transistor of the plate driver is close to being out of saturation. In the example of plate driver 760, the biasing voltage is the gate voltage of transistor M3. In one example, the first level and the second level of the biasing voltage are determined for providing the required or desirable slew rates of falling segment 1373 for first portion 1373-A and second portion 1373-B, respectively. The resulting slew rate of first portion 1373-A and slew rate of second portion 1373-B may be substantially equal, providing falling edge 1373 of plate voltage 1372 with a desired linearity.

While the plate voltage during a digit line low sensing process is specifically discussed as an example, the present subject matter can be applied to control slew rate of any access line during any access process. For example, the present subject matter may be applied for digit line high (DL=H) sensing to control the slew rate at which the plate voltage ramps up. The plate driver may include a p-channel metal-oxide-semiconductor field-effect transistor (PMOS transistor, instead of the NMOS transistor as illustrated in FIG. 7) driven by the biasing voltage. The present subject matter may also be applied to slew rate control in other access lines and/or scenarios. For example, the present subject matter may be applied to control the slew rate for digit line voltage rising or digit line voltage falling to mitigate crosstalk between adjacent digit lines.

Figure 14:
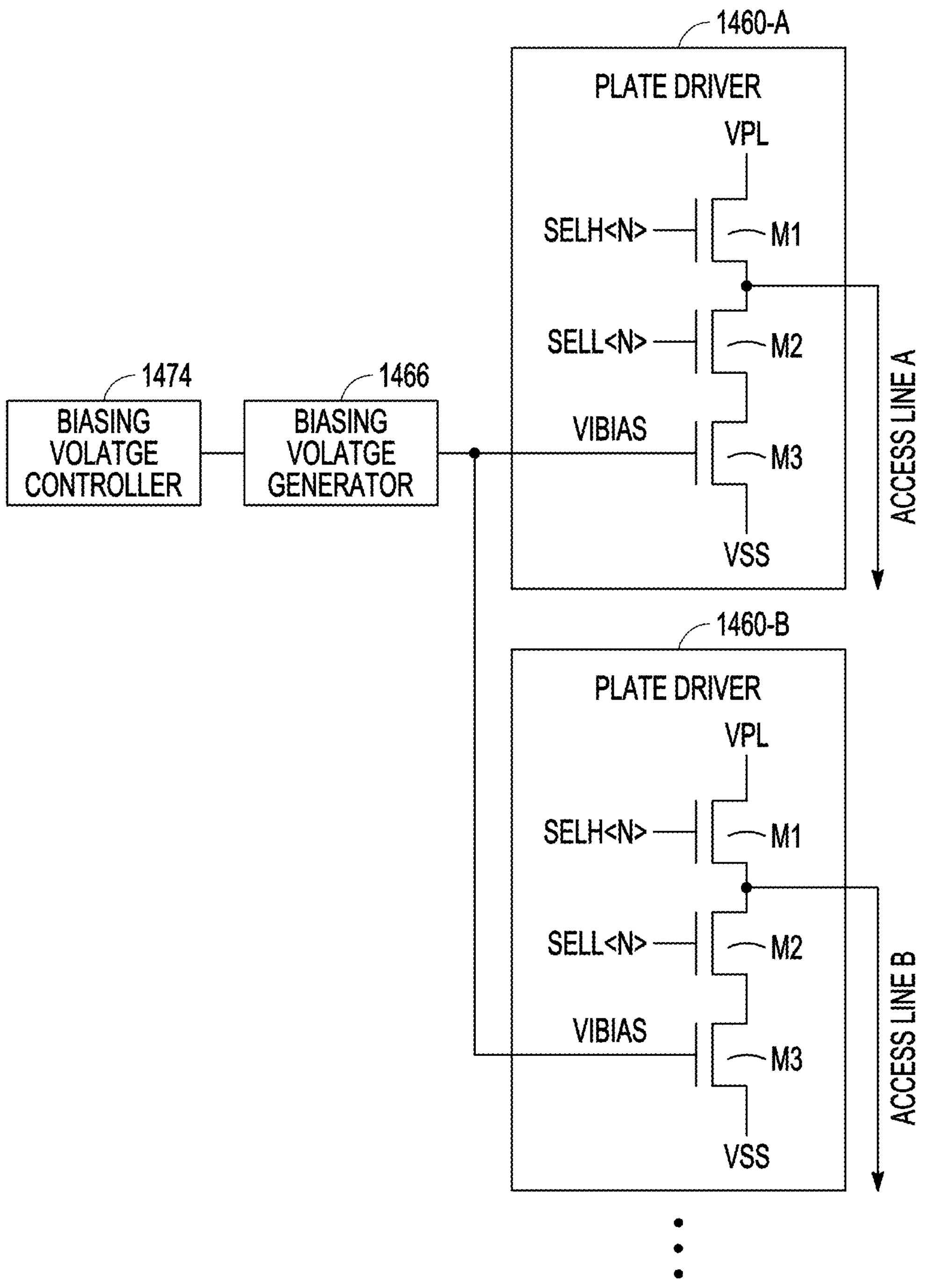
FIG. 14 illustrates an example of a system for driving access lines in a memory device, such as the memory device of FIG. 6, according to the present subject matter.

FIG. 14 illustrates an example of a system for driving access lines in a memory device, such as the memory device of FIG. 6, according to the present subject matter. The system may include multiple access line drivers 1460 (access line driver 1460-A, access line driver 1460-B, . . . ), a biasing voltage generator 1466, and a biasing voltage controller 1474.

Access line drivers 1460 are each coupled to a respective access line of multiple access lines (access line A, access line B, . . . ) to drive that access line. Access line drivers 1460 may each receive a biasing voltage (VIBIAS) and produce an access line voltage on the respective access line. The access line voltage is a function of the biasing voltage. Access line drivers 1460 may each include a transistor that may receive the biasing voltage and produce a current driving the respective access line. Biasing voltage generator 1466 may generate the biasing voltage to be received by each access line driver of access line drivers 1460. Biasing voltage controller 1474 may control the biasing voltage. In one example, biasing voltage controller 1474 is part of the memory controller, such as memory controller 150. In one example of controlling the biasing voltage, biasing voltage controller 1474 may maintain a level of the biasing voltage for a specified slew rate of the access line voltage when the access line voltage is above a threshold and increase the level of the biasing voltage to maintain the specified slew rate of the access line voltage when the access line voltage falls below the threshold. The threshold may be determined based on characteristics of access line drivers 1460 (e.g., the threshold voltage of transistor M3, or Vgs-Vth of M3). For example, the threshold may be set slightly higher than Vgs-Vth of M3 being an NMOS transistor that is close to being out of saturation as the access line voltage approaches Vgs-Vth.

While transistors M1, M2, and M3 are shown as NMOS transistors coupled between voltage supply lines VPL and VSS, they may be PMOS transistor coupled between corresponding voltage supply lines, as understood by those skilled in the art. Examples of the access lines include, but not limited to, plate lines (or plates) and digit lines.

Figure 15:
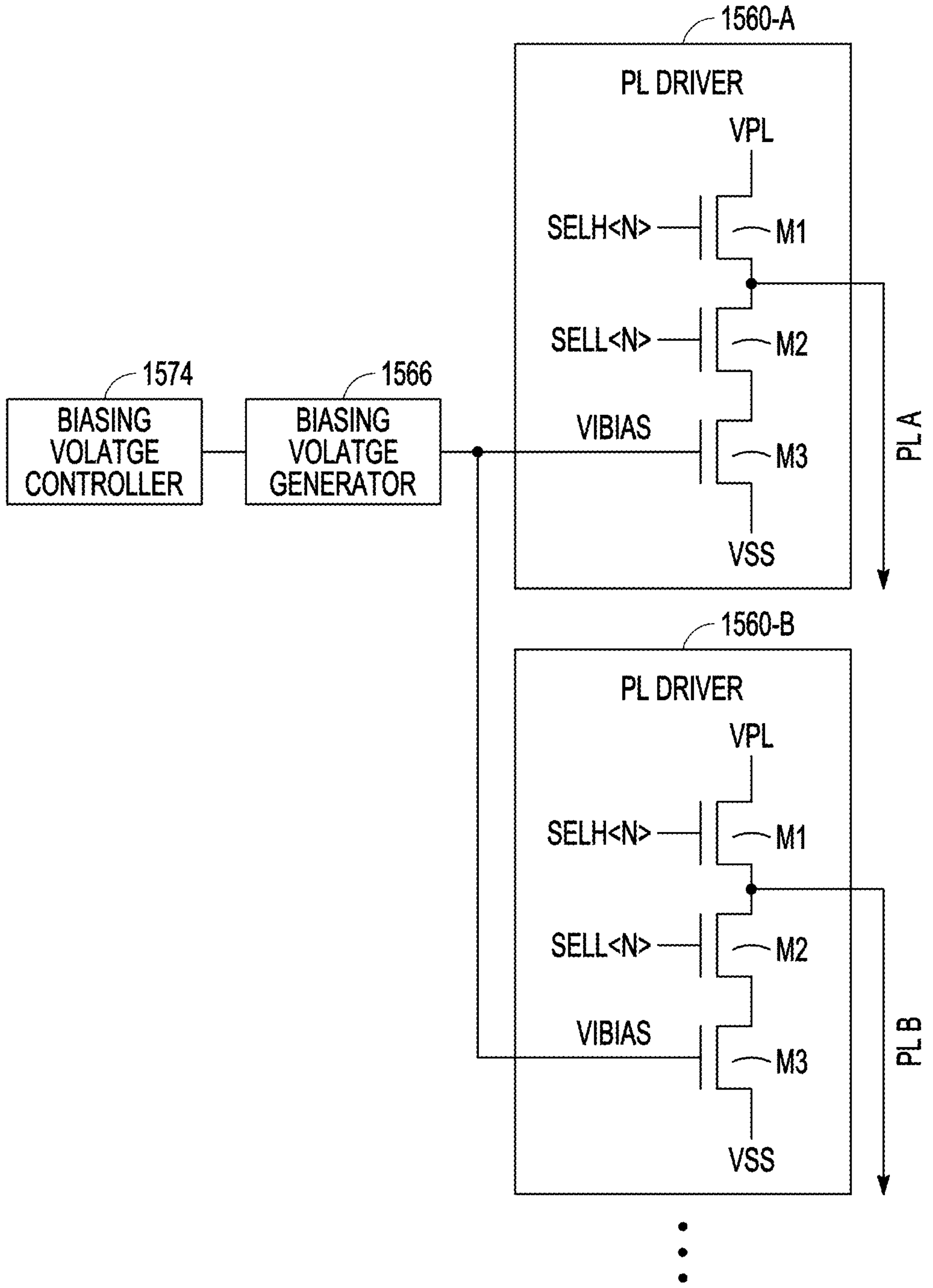
FIG. 15 illustrates an example of a system for driving plates in a memory device, such as the memory device of FIG. 6, according to the present subject matter.

FIG. 15 illustrates an example of a system for driving plates in a memory device, such as the memory device of FIG. 6, according to the present subject matter. The system is a specific example of the system of FIG. 14 and may include multiple plate (PL) drivers 1560 (plate driver 1560-A, plate driver 1560-B, . . . ), a biasing voltage generator 1566, and a biasing voltage controller 1574.

Plate drivers 1560 are each coupled to a respective plate of multiple plates (PL A, PL B, . . . ) to drive that plate. Plate drivers 1560 may each receive a biasing voltage (VIBIAS) and produce a plate voltage on the respective plate. The plate voltage is a function of the biasing voltage. Plate drivers 1560 may each include a transistor that may receive the biasing voltage and produce a current driving the respective plate. Biasing voltage generator 1566 may generate the biasing voltage to be received by each plate driver of plate drivers 1560. Biasing voltage controller 1574 may control the biasing voltage. In one example, biasing voltage controller 1574 is part of the memory controller, such as memory controller 150. In one example of controlling the biasing voltage, biasing voltage controller 1574 may maintain a level of the biasing voltage for a specified slew rate of the plate voltage when the plate voltage is above a threshold and increase the level of the biasing voltage to maintain the specified slew rate of the plate voltage when the plate voltage falls below the threshold. The threshold may be determined based on characteristics of plate drivers 1560 (e.g., the threshold voltage of transistor M3, or Vgs-Vth of M3). For example, the threshold may be set slightly higher than Vgs-Vth of M3 being an NMOS transistor that is close to being out of saturation as the plate voltage approaches Vgs-Vth. While transistors M1, M2, and M3 are shown as NMOS transistors coupled between voltage supply lines VPL and VSS, they may be PMOS transistor coupled between corresponding voltage supply lines, as understood by those skilled in the art.

Figure 16:
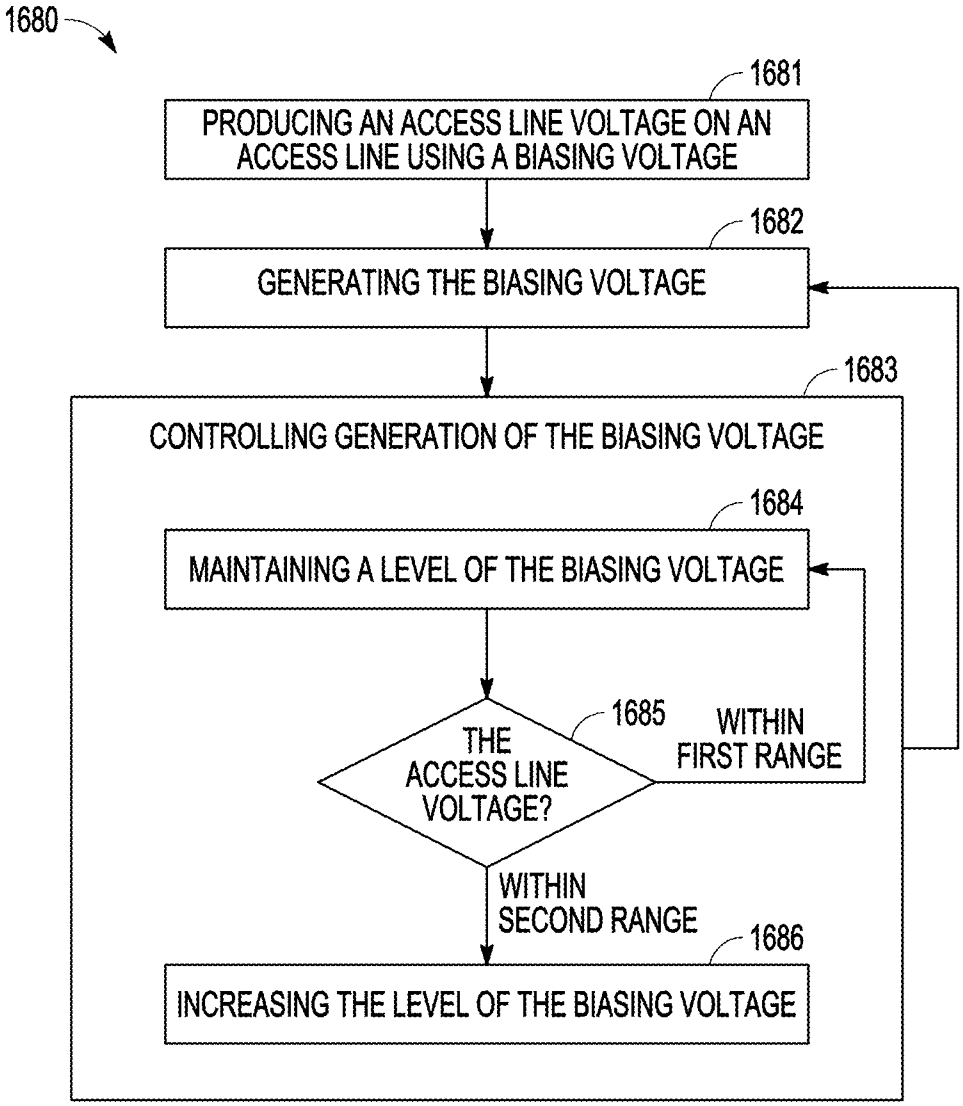
FIG. 16 illustrates an example of a method for controlling slew rate of a voltage on an access line of a memory device, according to the present subject matter.

FIG. 16 illustrates an example of a method 1680 for controlling slew rate of a voltage on an access line of a memory device, according to the present subject matter. The memory device may include multiple memory cells such as ferroelectric memory cells. The access line is one of multiple access lines of the memory device coupled to multiple respective memory cells for writing to and reading from the respective memory cells. In one example, method 1680 may be performed using the system including access line drivers 1460, biasing voltage generator 1466, and biasing voltage controller 1474, as illustrated in FIG. 14. In a specific example, the access line is a plate line, and method 1680 may be performed using the system including plate drivers 1560, biasing voltage generator 1566, and biasing voltage controller 1574, as illustrated in FIG. 15.

At operation 1681, an access line voltage is produced on an access line of the multiple access lines of the memory device using a biasing voltage. The access line voltage is a function of the biasing voltage. Examples of the access line include a plate line or a digit line. At operation 1682, the biasing voltage is generated.

At operation 1683, the generation of the biasing voltage is controlled, such as using a memory controller of the memory device. Operation 1683 may include operations 1684, 1685, and 1686. At operation 1684, a level of the biasing voltage is maintained for a specified slew rate of the access line voltage. At operation 1685, whether the access line voltage is within a first range or a second range is determined, such as by comparing the access line voltage to a threshold. If the access line voltage is within the first range, the level of the biasing voltage is continued to be maintained at operation 1684. If the access line voltage is within the second range, the level of the biasing voltage is increased at operation 1686. A transistor may be used to receive the biasing voltage and produce a current driving the access line. In one example, the access line is driven using an NMOS or PMOS transistor receiving the biasing voltage. The first range corresponds to the access line voltage when the transistor operates in saturation. The second range corresponds to the access line voltage when the transistor is out of saturation. The first range and the second range may be separated by a threshold at which the transistor is close to operating out of saturation, such that the level of the biasing voltage is increased when the transistor is about to start operating out of saturation. The threshold may be determined based on the threshold voltage of the transistor.

Figure 17:
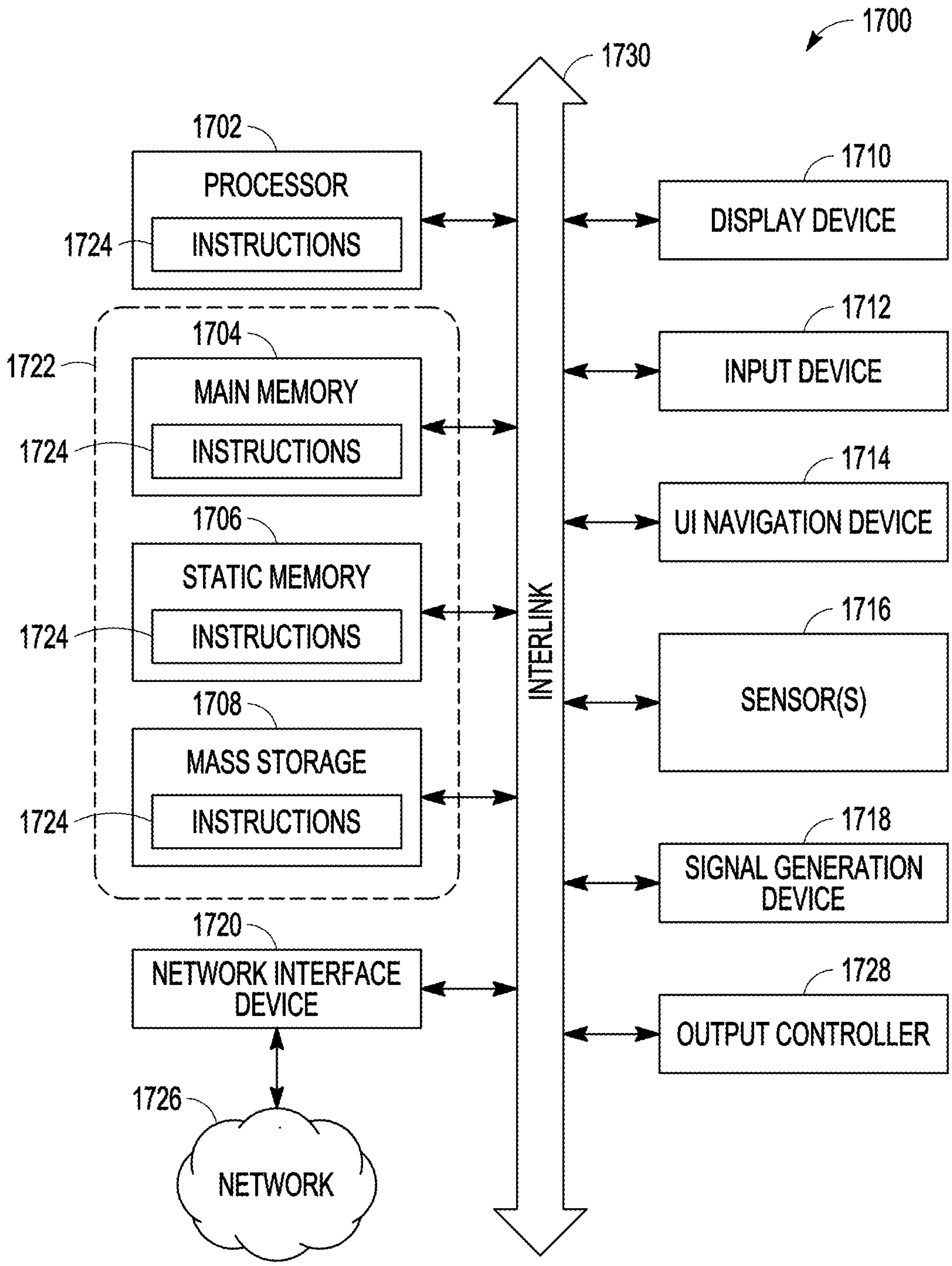
FIG. 17 illustrates a block diagram of an example machine with which, in which, or by which any one or more of the techniques discussed herein can be implemented.

FIG. 17 illustrates a block diagram of an example machine 1700 with which, in which, or by which any one or more of the techniques (e.g., circuits or methods) discussed herein can be implemented. Examples, as discussed herein, can include, or can operate by, logic or a number of components, or mechanisms in machine 1700. Circuitry (e.g., circuitry for accessing memory cells) is a collection of circuits implemented in tangible entities of machine 1700 that include hardware (e.g., simple circuits, gates, logic, etc.). Circuitry membership can be flexible over time. Circuitries include members that can, alone or in combination, perform specified operations when operating. In an example, the hardware of the circuitry can include variably connected physical components (e.g., execution units, transistors, simple circuits, etc.) including a machine-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

In alternative embodiments, machine 1700 can operate as a standalone device or can be connected (e.g., networked) to other machines. In a networked deployment, machine 1700 can operate in the capacity of a server machine, a client machine, or both in server-client network environments. In an example, machine 1700 can act as a peer machine in peer-to-peer (P2P) (or other distributed) network environment. Machine 1700 can be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Machine 1700 (e.g., computer system) can include a hardware processor 1702 or host device (e.g., a central processing unit (CPU), a graphics processing unit (GPU), a hardware processor core, or any combination thereof), a main memory 1704, a static memory 1706 (e.g., memory or storage for firmware, microcode, a basic-input-output (BIOS), unified extensible firmware interface (UEFI), etc.), and mass storage device 1708 or memory die stack (e.g., a memory die stack, hard drives, tape drives, flash storage, or other block devices) some or all of which can communicate with each other via an interlink 1730 (e.g., bus). Machine 1700 can further include a display device 1710, an alphanumeric input device 1712 (e.g., a keyboard), and a user interface (UI) Navigation device 1714 (e.g., a mouse). In an example, display device 1710, input device 1712, and UI navigation device 1714 can be a touch screen display. Machine 1700 can additionally include a mass storage device 1708 (e.g., a drive unit), a signal generation device 1718 (e.g., a speaker), a network interface device 1720, and one or more sensor(s) 1716, such as a global positioning system (GPS) sensor, compass, accelerometer, or other sensor. Machine 1700 can include an output controller 1728, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of hardware processor 1702, main memory 1704, static memory 1706, or mass storage device 1708 can be, or include, a machine-readable media 1722 on which is stored one or more sets of data structures or instructions 1724 (e.g., software) embodying or used by any one or more of the techniques or functions discussed herein. Instructions 1724 can also reside, completely or at least partially, within any of registers of hardware processor 1702, main memory 1704, static memory 1706, or mass storage device 1708 during execution thereof by machine 1700. In an example, one or any combination of hardware processor 1702, main memory 1704, static memory 1706, or mass storage device 1708 can constitute machine-readable media 1722. While machine-readable media 1722 is illustrated as a single medium, the term "machine-readable medium" can include a single medium or multiple media (e.g., a centralized or distributed database, or associated caches and servers) configured to store one or more instructions 1724.

The term "machine-readable medium" can include any medium that is capable of storing, encoding, or carrying instructions for execution by machine 1700 and that cause machine 1700 to perform any one or more of the techniques of the present disclosure, or that is capable of storing, encoding or carrying data structures used by or associated with such instructions. Non-limiting machine-readable medium examples can include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine-readable media can include: non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks.

In an example, information stored or otherwise provided on machine-readable media 1722 can be representative of instructions 1724, such as instructions 1724 themselves or a format from which instructions 1724 can be derived. This format from which instructions 1724 can be derived can include source code, encoded instructions (e.g., in compressed or encrypted form), packaged instructions (e.g., split into multiple packages), or the like. The information representative of instructions 1724 in machine-readable media 1722 can be processed by processing circuitry into the instructions to implement any of the operations discussed herein. For example, deriving instructions 1724 from the information (e.g., processing by the processing circuitry) can include: compiling (e.g., from source code, object code, etc.), interpreting, loading, organizing (e.g., dynamically or statically linking), encoding, decoding, encrypting, unencrypting, packaging, unpackaging, or otherwise manipulating the information into instructions 1724.

In an example, the derivation of instructions 1724 can include assembly, compilation, or interpretation of the information (e.g., by the processing circuitry) to create instructions 1724 from some intermediate or preprocessed format provided by machine-readable media 1722. The information, when provided in multiple parts, can be combined, unpacked, and modified to create instructions 1724. For example, the information can be in multiple compressed source code packages (or object code, or binary executable code, etc.) on one or several remote servers. The source code packages can be encrypted when in transit over a network and decrypted, uncompressed, assembled (e.g., linked) if necessary, and compiled or interpreted (e.g., into a library, stand-alone executable etc.) at a local machine, and executed by the local machine.

Instructions 1724 can be further transmitted or received over a communications network 1726 using a transmission medium via network interface device 1720 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), plain old telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, network interface device 1720 can include one or more physical jacks (e.g., Ethernet, coaxial, or phone jacks) or one or more antennas to connect to network 1726. In an example, network interface device 1720 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by machine 1700, and includes digital or analog communications signals or other intangible medium to facilitate communication of such software. A transmission medium is a machine-readable medium.

Some non-limiting examples (Examples 1-20) of the present subject matter are provided as follows:

In Example 1, an electronic device may include multiple memory cells, multiple access lines respectively coupled to the multiple memory cells, and multiple access line drivers each coupled to a respective access line of the multiple access lines and configured to drive that access line. The multiple access line drivers may each be configured to receive a biasing voltage and to produce an access line voltage on the respective access line. The access line voltage may be a function of the received biasing voltage. The electronic device may further include a biasing voltage generator and a biasing voltage controller. The biasing voltage generator may be configured to generate the biasing voltage to be received by each access line driver of the multiple access line drivers. The biasing voltage controller may be configured to maintain a level of the biasing voltage for a specified slew rate of the access line voltage when the access line voltage is within a first range and to change the level of the biasing voltage to maintain the specified slew rate of the access line voltage when the access line voltage is within a second range.

In Example 2, the subject matter of Example 1 may optionally be configured such that the multiple memory cells include multiple ferroelectric random access memory cells.

In Example 3, the subject matter of any one or a combination of Examples 1 and 2 may optionally be configured such that the multiple access lines include multiple plate lines, and the multiple access line drivers are each coupled to a respective plate line of the multiple plate lines to drive that plate line.

In Example 4, the subject matter of any one or a combination of Examples 1 and 2 may optionally be configured such that the multiple access lines include multiple digit lines, and the multiple access line drivers are each coupled to a respective digit line of the multiple digit lines to drive that digit line.

In Example 5, the subject matter of any one or any combination of Examples 1 to 4 may optionally be configured such that the access line drivers each include a transistor configured to receive the biasing voltage and to produce a current driving the respective access line, and the first and second ranges are determined based on one or more characteristics of the transistor.

In Example 6, the subject matter of Example 5 may optionally be configured such that the biasing voltage controller is configured to maintain the level of the biasing voltage for a specified rising slew rate of the voltage on the access line when the voltage on the access line is below a threshold and to increase the level of the biasing voltage to maintain the specified rising slew rate of the voltage on the access line when the voltage on the access line is above the threshold.

In Example 7, the subject matter of Example 5 may optionally be configured such that the biasing voltage controller is configured to maintain the level of the biasing voltage for a specified falling slew rate of the voltage on the access line when the voltage on the access line is above a threshold and to increase the level of the biasing voltage to maintain the specified falling slew rate of the voltage on the access line when the voltage on the access line is below the threshold.

In Example 8, a memory device may include multiple memory cells, multiple plates each coupled to a respective group of memory cells of the multiple memory cells, and multiple plate drivers each coupled to a respective plate of the multiple plates and configured to drive that plate. The multiple plate drivers may each be configured to receive a biasing voltage and to produce a plate voltage on the respective plate. The plate voltage may be a function of the received biasing voltage. The memory device may further include a biasing voltage generator and a biasing voltage controller. The biasing voltage generator may be configured to generate the biasing voltage to be received by each plate driver of the multiple plate drivers. The biasing voltage controller may be configured to maintain a level of the biasing voltage for a specified slew rate of the plate voltage when the plate voltage is within a first range and to change the level of the biasing voltage to maintain the specified slew rate of the plate voltage when the plate voltage is within a second range.

In Example 9, the subject matter of Example 8 may optionally be configured such that the multiple memory cells include multiple ferroelectric random access memory cells.

In Example 10, the subject matter of any one or a combination of Examples 8 and 9 may optionally be configured such that the biasing voltage controller is configured to maintain the level of the biasing voltage for a specified falling slew rate of the plate voltage when the plate voltage is above a threshold and to increase the level of the biasing voltage to maintain the specified falling slew rate of the plate voltage when the plate voltage is below the threshold.

In Example 11, the subject matter of Example 10 may optionally be configured such that the plate drivers each include an n-channel metal-oxide-semiconductor field-effect transistor configured to receive the biasing voltage and to produce a current driving the respective plate, and the threshold is determined based on the threshold voltage of the transistor.

In Example 12, the subject matter of any one or a combination of Examples 8 and 9 may optionally be configured such that the biasing voltage controller is configured to maintain the level of the biasing voltage for a specified rising slew rate of the plate voltage when the plate voltage is below a threshold and to increase the level of the biasing voltage to maintain the specified rising slew rate of the plate voltage when the plate voltage is above the threshold.

In Example 13, the subject matter of Example 12 may optionally be configured such that the plate drivers each include a p-channel metal-oxide-semiconductor field-effect transistor configured to receive the biasing voltage and to produce a current driving the respective plate, and the threshold is determined based on the threshold voltage of the transistor.

In Example 14, a method is provided. The method may include accessing memory cells through respective multiple access lines coupled to the memory cells and producing an access line voltage on an access line of the multiple access lines using a biasing voltage. The access line voltage may be a function of the biasing voltage. The method may further include generating the biasing voltage and controlling the generation of the biasing voltage. Controlling the generation of the biasing voltage may include maintaining a level of the biasing voltage for a specified slew rate of the access line voltage when the access line voltage is within a first range and changing the level of the biasing voltage to maintain the specified slew rate of the access line voltage when the access line voltage is within a second range.

In Example 15, the subject matter of producing the access line voltage on the access line of the multiple access lines as found in Example 14 may optionally include producing a plate voltage on a plate of the multiple access lines.

In Example 16, the subject matter of producing the access line voltage on the access line of the multiple access lines as found in Example 14 may optionally include producing a digit line voltage on a digit line of the multiple access lines.

In Example 17, the subject matter of producing the access line voltage on the access line of the multiple access lines using the biasing voltage as found in any one or any combination of Examples 14 to 16 may optionally include using a transistor configured to receive the biasing voltage and produce a current driving the access line, and the subject matter of any one or any combination of Examples 14 to 16 may optionally further include determining the first and second ranges base on a threshold voltage of the transistor.

In Example 18, the subject matter of controlling the generation of the biasing voltage as found in Example 17 may optionally include: maintaining the level of the biasing voltage when the transistor operates in saturation; and starting to increase the level of the biasing voltage when the transistor starts to operate out of saturation.

In Example 19, the subject matter of controlling the generation of the biasing voltage as found in Example 18 may optionally include: maintaining the level of the biasing voltage for a specified rising slew rate of the access line voltage when the access line voltage is below a threshold; and increasing the level of the biasing voltage to maintain the specified rising slew rate of the access line voltage when the access line voltage is above the threshold.

In Example 20, the subject matter of controlling the generation of the biasing voltage as found in Example 18 may optionally include: maintaining the level of the biasing voltage for a specified falling slew rate of the access line voltage when the access line voltage is above a threshold; and increasing the level of the biasing voltage to maintain the specified falling slew rate of the access line voltage when the access line voltage is below the threshold.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or discussed. However, the present inventors also contemplate examples in which only those elements shown or discussed are provided. Moreover, the present inventors also contemplate examples using any combination or permutation of those elements shown or discussed (or one or more aspects thereof), either with respect to a particular example (or one or more aspects thereof), or with respect to other examples (or one or more aspects thereof) shown or discussed herein.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either coupled, or directly coupled, unless otherwise indicated.

The above description is intended to be illustrative, and not restrictive. For example, the above-discussed examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electronic device, comprising:

multiple memory cells;

multiple access lines respectively coupled to the multiple memory cells;

multiple access line drivers each coupled to a respective access line of the multiple access lines and configured to drive that access line, the multiple access line drivers each including a transistor configured to receive a biasing voltage and to produce a current driving the respective access line, the current being a function of the received biasing voltage;

a biasing voltage generator configured to generate the biasing voltage to be received by each access line driver of the multiple access line drivers; and a biasing voltage controller configured to maintain a level of the biasing voltage for a specified slew rate of the access line voltage when the access line voltage is within a first range within which the transistor operates in saturation and to change the level of the biasing voltage to maintain the specified slew rate of the access line voltage when the access line voltage is within a second range within which the transistor operates out of saturation.

2. The electronic device of claim 1, wherein the multiple memory cells comprise multiple ferroelectric random access memory cells.

3. The electronic device of claim 1, wherein the multiple access lines comprise multiple plate lines, and the multiple access line drivers are each coupled to a respective plate line of the multiple plate lines to drive that plate line.

4. The electronic device of claim 1, wherein the multiple access lines comprise multiple digit lines, and the multiple access line drivers are each coupled to a respective digit line of the multiple digit lines to drive that digit line.

5. The electronic device of claim 1, wherein the transistor comprises an n-channel metal-oxide-semiconductor field-effect transistor or a p-channel metal-oxide-semiconductor field-effect transistor.

6. The electronic device of claim 1, wherein the biasing voltage controller is configured to maintain the level of the biasing voltage for a specified rising slew rate of the voltage on the access line when the voltage on the access line is below a threshold and to increase the level of the biasing voltage to maintain the specified rising slew rate of the voltage on the access line when the voltage on the access line is above the threshold.

7. The electronic device of claim 1, wherein the biasing voltage controller is configured to maintain the level of the biasing voltage for a specified falling slew rate of the voltage on the access line when the voltage on the access line is above a threshold and to increase the level of the biasing voltage to maintain the specified falling slew rate of the voltage on the access line when the voltage on the access line is below the threshold.

8. A memory device, comprising:
- multiple memory cells;
- multiple plates each coupled to a respective group of memory cells of the multiple memory cells;
- multiple plate drivers each coupled to a respective plate of the multiple plates and configured to drive that plate, the multiple plate drivers each configured to receive a biasing voltage and to produce a plate voltage on the respective plate, the plate voltage being a function of the received biasing voltage;
- a biasing voltage generator configured to generate the biasing voltage to be received by each plate driver of the multiple plate drivers; and
- a biasing voltage controller configured to:
  - maintain a level of the biasing voltage for a specified falling slew rate of the plate voltage when the plate voltage is within a first range and to increase the level of the biasing voltage to maintain the specified falling slew rate of the plate voltage when the plate voltage is within a second range; or
- maintain the level of the biasing voltage for a specified rising slew rate of the plate voltage when the plate voltage is within the second range and to increase the level of the biasing voltage to maintain the specified rising slew rate of the plate voltage when the plate voltage is within the first range.

9. The memory device of claim 8, wherein the multiple memory cells comprise multiple ferroelectric random access memory cells.

10. The memory device of claim 8, wherein the biasing voltage controller is configured to maintain the level of the biasing voltage for the specified falling slew rate of the plate voltage when the plate voltage is above a threshold and to increase the level of the biasing voltage to maintain the specified falling slew rate of the plate voltage when the plate voltage is below the threshold.

11. The memory device of claim 10, wherein the plate drivers each comprise an n-channel metal-oxide-semiconductor field-effect transistor configured to receive the biasing voltage and to produce a current driving the respective plate, and the threshold is determined based on the threshold voltage of the transistor.

12. The memory device of claim 8, wherein the biasing voltage controller is configured to maintain the level of the biasing voltage for the specified rising slew rate of the plate voltage when the plate voltage is below a threshold and to increase the level of the biasing voltage to maintain the specified rising slew rate of the plate voltage when the plate voltage is above the threshold.

13. The memory device of claim 12, wherein the plate drivers each comprise a p-channel metal-oxide-semiconductor field-effect transistor configured to receive the biasing voltage and to produce a current driving the respective plate, and the threshold is determined based on the threshold voltage of the transistor.

14. A method, comprising:
- accessing memory cells through respective multiple access lines coupled to the memory cells;
- producing an access line voltage on an access line of the multiple access lines using a transistor receiving a biasing voltage and producing a current driving the access line, the access line voltage being a function of the biasing voltage;
- generating the biasing voltage; and
- controlling the generation of the biasing voltage, including maintaining a level of the biasing voltage for a specified slew rate of the access line voltage when the access line voltage is within a first range and changing the level of the biasing voltage to maintain the specified slew rate of the access line voltage when the access line voltage is within a second range, the first range being a range of the access line voltage within which the transistor operates in saturation, the second range being a range of the access line voltage within which the transistor operates out of saturation.

15. The method of claim 14, wherein producing the access line voltage on the access line of the multiple access lines comprises producing a plate voltage on a plate of the multiple access lines.

16. The method of claim 14, wherein producing the access line voltage on the access line of the multiple access lines comprises producing a digit line voltage on a digit line of the multiple access lines.

17. The method of claim 14, wherein accessing the memory cells comprises accessing ferroelectric random access memory cells.

18. The method of claim 14, wherein controlling the generation of the biasing voltage comprises:
- maintaining the level of the biasing voltage when the transistor operates in saturation; and
- starting to increase the level of the biasing voltage when the transistor starts to operate out of saturation.

19. The method of claim 18, wherein controlling the generation of the biasing voltage comprises:
- maintaining the level of the biasing voltage for a specified rising slew rate of the access line voltage when the access line voltage is below a threshold; and
- increasing the level of the biasing voltage to maintain the specified rising slew rate of the access line voltage when the access line voltage is above the threshold.

20. The method of claim 18, wherein controlling the generation of the biasing voltage comprises:
- maintaining the level of the biasing voltage for a specified falling slew rate of the access line voltage when the access line voltage is above a threshold; and increasing the level of the biasing voltage to maintain the specified falling slew rate of the access line voltage when the access line voltage is below the threshold.

* * * * *